United States Patent
Tanaka (10) Patent No.: US 10,228,386 B2
(45) Date of Patent: *Mar. 12, 2019

(54) PHYSICAL QUANTITY SENSOR, ELECTRONIC DEVICE, AND MOBILE BODY

(71) Applicant: Seiko Epson Corporation, Tokyo (JP)

(72) Inventor: Satoru Tanaka, Chino (JP)

(73) Assignee: Seiko Epson Corporation (JP)

(*) Notice: Subject to any disclaimer, the term of this patent is extended or adjusted under 35 U.S.C. 154(b) by 206 days.

This patent is subject to a terminal disclaimer.

(21) Appl. No.: 14/817,457

(22) Filed: Aug. 4, 2015

(65) Prior Publication Data

US 2016/0061858 A1   Mar. 3, 2016

(30) Foreign Application Priority Data

Aug. 27, 2014   (JP) .................... 2014-172676

(51) Int. Cl.
  *G01P 15/125*   (2006.01)
  *G01P 15/13*   (2006.01)
  (Continued)

(52) U.S. Cl.
  CPC .......... *G01P 15/131* (2013.01); *B81B 3/0021* (2013.01); *G01C 19/5712* (2013.01); *G01P 15/125* (2013.01); *B81B 2201/025* (2013.01); *B81B 2203/0181* (2013.01); *B81B 2203/04* (2013.01); *B81B 2207/07* (2013.01); *G01P 2015/0831* (2013.01)

(58) Field of Classification Search
  CPC .. G01P 15/125; G01P 15/0802; G01P 15/097; G01P 15/0975; G01C 19/5755; G01C 19/5769; G01C 19/5712
  See application file for complete search history.

(56) References Cited

U.S. PATENT DOCUMENTS 5,388,460 A    2/1995 Sakurai et al.
5,488,864 A *  2/1996 Stephan ............... G01P 15/125
                                                73/514.32
(Continued)

FOREIGN PATENT DOCUMENTS

DE   10-2008-043790 A1   5/2010
JP   H04-299267 A   10/1992
(Continued)

*Primary Examiner* — Helen C Kwok
(74) *Attorney, Agent, or Firm* — Harness, Dickey & Pierce, P.L.C.

(57) ABSTRACT

A physical quantity sensor has a first movable section, a second movable section that has a rotational moment, which is generated when acceleration is applied, that is different from the first movable section, a movable section that is supported so as to be able to rock about an axis which is positioned between the first movable section and the second movable section, a first detection electrode which is arranged so as to oppose the first movable section, a second detection electrode which is arranged so as to oppose the second movable section, and a frame-form section which is arranged so as to surround at least a portion of the periphery of the movable section in planar view of the movable section and which has the same potential as the movable section.

16 Claims, 6 Drawing Sheets

(51) Int. Cl.
  G01C 19/5712   (2012.01)
  B81B 3/00   (2006.01)
  G01P 15/08   (2006.01)

(56) References Cited

U.S. PATENT DOCUMENTS

| | | | |
|---|---|---|---|
| 5,594,172 A * | 1/1997 | Shinohara | G01P 15/0802 73/514.33 |
| 6,577,975 B2 | 6/2003 | Chiesa | |
| 8,079,262 B2 * | 12/2011 | Guo | G01P 15/0802 73/514.32 |
| 9,073,744 B2 | 7/2015 | Tanaka | |
| 9,810,712 B2 * | 11/2017 | Tanaka | G01P 15/125 |
| 2002/0143484 A1 | 10/2002 | Chiesa | |
| 2008/0134785 A1 * | 6/2008 | Pruetz | G01P 15/125 73/514.32 |
| 2009/0194397 A1 * | 8/2009 | Merassi | G01P 15/125 200/61.53 |
| 2010/0122578 A1 * | 5/2010 | Classen | G01P 15/0802 73/514.32 |
| 2010/0186508 A1 * | 7/2010 | Guenther | G01C 25/00 73/504.14 |
| 2011/0048131 A1 * | 3/2011 | Reinmuth | B81B 3/0051 73/504.12 |
| 2012/0031185 A1 * | 2/2012 | Classen | G01P 15/125 73/514.14 |
| 2013/0042684 A1 * | 2/2013 | Yoda | G01P 15/125 73/514.01 |
| 2013/0192370 A1 * | 8/2013 | Yoda | G01P 15/02 73/514.01 |
| 2013/0228013 A1 * | 9/2013 | Tanaka | G01P 15/08 73/514.16 |
| 2013/0229193 A1 | 9/2013 | Kakimoto et al. | |
| 2013/0264661 A1 | 10/2013 | Tanaka | |
| 2013/0269434 A1 * | 10/2013 | Kamisuki | G01P 15/125 73/514.32 |
| 2014/0144235 A1 * | 5/2014 | Suzuki | G01P 15/125 73/514.32 |
| 2014/0174183 A1 * | 6/2014 | Comi | G01P 15/0975 73/514.38 |
| 2014/0208849 A1 * | 7/2014 | Zhang | G01P 15/125 73/514.32 |
| 2014/0338451 A1 * | 11/2014 | Takagi | G01P 15/125 73/514.32 |
| 2015/0013458 A1 * | 1/2015 | Tanaka | B81B 3/0051 73/514.35 |
| 2015/0298967 A1 | 10/2015 | Tanaka | |
| 2015/0368089 A1 * | 12/2015 | Goda | B81B 3/0008 257/418 |
| 2016/0047839 A1 * | 2/2016 | Tanaka | G01P 15/125 73/514.32 |

FOREIGN PATENT DOCUMENTS

| | | |
|---|---|---|
| JP | 2002-202320 A | 7/2002 |
| JP | 2007-298405 A | 11/2007 |
| JP | 2012-157941 A | 8/2012 |
| JP | 2012-181030 A | 9/2012 |
| JP | 2012-185418 A | 9/2012 |
| JP | 2012-220262 A | 11/2012 |
| JP | 2013-011549 A | 1/2013 |
| JP | 2013-040856 A | 2/2013 |
| JP | 2013-156121 A | 8/2013 |
| JP | 2013-160554 A | 8/2013 |
| JP | 2013-181884 A | 9/2013 |
| JP | 2013-217772 A | 10/2013 |

* cited by examiner

PHYSICAL QUANTITY SENSOR, ELECTRONIC DEVICE, AND MOBILE BODY

BACKGROUND

1. Technical Field

The present invention relates to a physical quantity sensor, an electronic device, and a mobile body.

2. Related Art

For example, in JP-A-2007-298405, a physical quantity sensor which has a movable electrode section in which a large movable electrode section and a small movable electrode section are included, and the movable electrode section has a movable electrode which is supported on an insulating substrate so as to be able to rock in a see-saw form, a fixed electrode which is included to oppose the large movable electrode section and which forms an electrostatic capacity with the large movable electrode section, and a fixed electrode which is included to oppose the small movable electrode section and which forms an electrostatic capacity with the small movable electrode section is disclosed. In such a physical quantity sensor, when acceleration is applied in the thickness direction, since a movable electrode rocks based on the level of the applied acceleration and the electrostatic capacity changes corresponding to the rocking, it is possible to detect the acceleration based on the change of the electrostatic capacity.

However, when a wiring which is connected to each fixed electrode (a wiring with a different potential to the movable electrode) is arranged at the periphery of the movable electrode section, displacement of the movable electrode section when acceleration is applied is inhibited by electrostatic force which is generated between the wiring and the movable electrode section. That is, rocking of the movable electrode is inhibited according to the applied acceleration. For this reason, there is a problem in that a physical quantity sensing function is reduced.

SUMMARY

An advantage of some aspects of the invention is to provide a physical quantity sensor which has a superior physical quantity sensing function, an electronic device, and a mobile body.

The invention can be realized in the following application examples.

Application Example 1

According to this application example, there is provided a physical quantity sensor including: a movable electrode which includes a movable section that has a first movable section which is included at one side and a second movable section which is included at the other side that has a rotational moment, which is generated when acceleration is applied, that is different from the first movable section, and that is supported so as to be able to rock about an axis which is positioned between the first movable section and the second movable section; a first electrode which is arranged so as to oppose the first movable section; a second electrode which is arranged so as to oppose the second movable section; and a peripherally arranged section which is arranged so as to surround at least a portion of the periphery of the movable section in planar view of the movable section, and which has the same potential as the movable electrode.

In this manner, generation of unnecessary electrostatic force where influence is imparted on rocking of the movable section is reduced by providing the peripherally arranged section with the same potential as the movable section at the periphery of the movable section. For this reason, it is possible to cause the movable section to appropriately rock (be displaced) according to the received physical quantity, and it is possible to exhibit a superior physical quantity sensing function.

Application Example 2

In the physical quantity sensor according to the application example, it is preferable that the peripherally arranged section is electrically connected to the movable electrode.

Thereby, it is possible to simply make the peripherally arranged section have the same potential as the movable electrode.

Application Example 3

In the physical quantity sensor according to the application example, it is preferable that the peripherally arranged section has a frame form which surrounds the whole of the movable section in planar view of the movable section.

Thereby, it is possible to further reduce the generation of electrostatic force where influence is imparted on rocking of the movable electrode.

Application Example 4

In the physical quantity sensor according to the application example, it is preferable that a regulating section, which regulates displacement in a direction that is different from the rocking of the movable section, is included in the peripherally arranged section.

Thereby, it is possible to further reduce displacement of the movable section in an unintentional direction, and it is possible to reduce damage or the like to the physical quantity sensor.

Application Example 5

In the physical quantity sensor according to the application example, it is preferable that the regulating section has a projecting section which protrudes from the peripherally arranged section toward the movable section.

Thereby, the configuration of the regulating section is simplified. In addition, the contact area of the regulating section and the movable section is made small.

Application Example 6

In the physical quantity sensor according to the application example, it is preferable that the physical quantity sensor further includes a third electrode which is arranged so as to oppose the movable section, and not to overlap with the first electrode and the second electrode in planar view of the movable section, and has the same potential as the movable electrode.

Thereby, it is possible to further reduce the generation of electrostatic force by which influence is imparted on rocking of the movable section. In addition, it is possible to reduce sticking during anodic bonding (during manufacture).

Application Example 7

In the physical quantity sensor according to the application example, it is preferable that the third electrode is electrically connected to the movable electrode.

Thereby, it is possible to simply make the third electrode have the same potential as the movable electrode.

Application Example 8

In the physical quantity sensor according to the application example, it is preferable that the third electrode is included between the first electrode and the second electrode, at the opposite side to the second electrode of the first electrode, and at the opposite side to the first electrode of the second electrode.

Thereby, it is possible to more widely arrange the third electrode.

Application Example 9

According to this application example, there is provided an electronic device including the physical quantity sensor according to any one of the above-described application examples.

Thereby, it is possible to obtain the electronic device with high reliability.

Application Example 10

According to this application example, there is provided a mobile body including the physical quantity sensor according to any one of the above-described application examples.

Thereby, it is possible to obtain the mobile body with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A physical quantity sensor, an electronic device, and a mobile body of the invention will be described below in detail based on the embodiments which are illustrated in the drawings.

Figure 1:
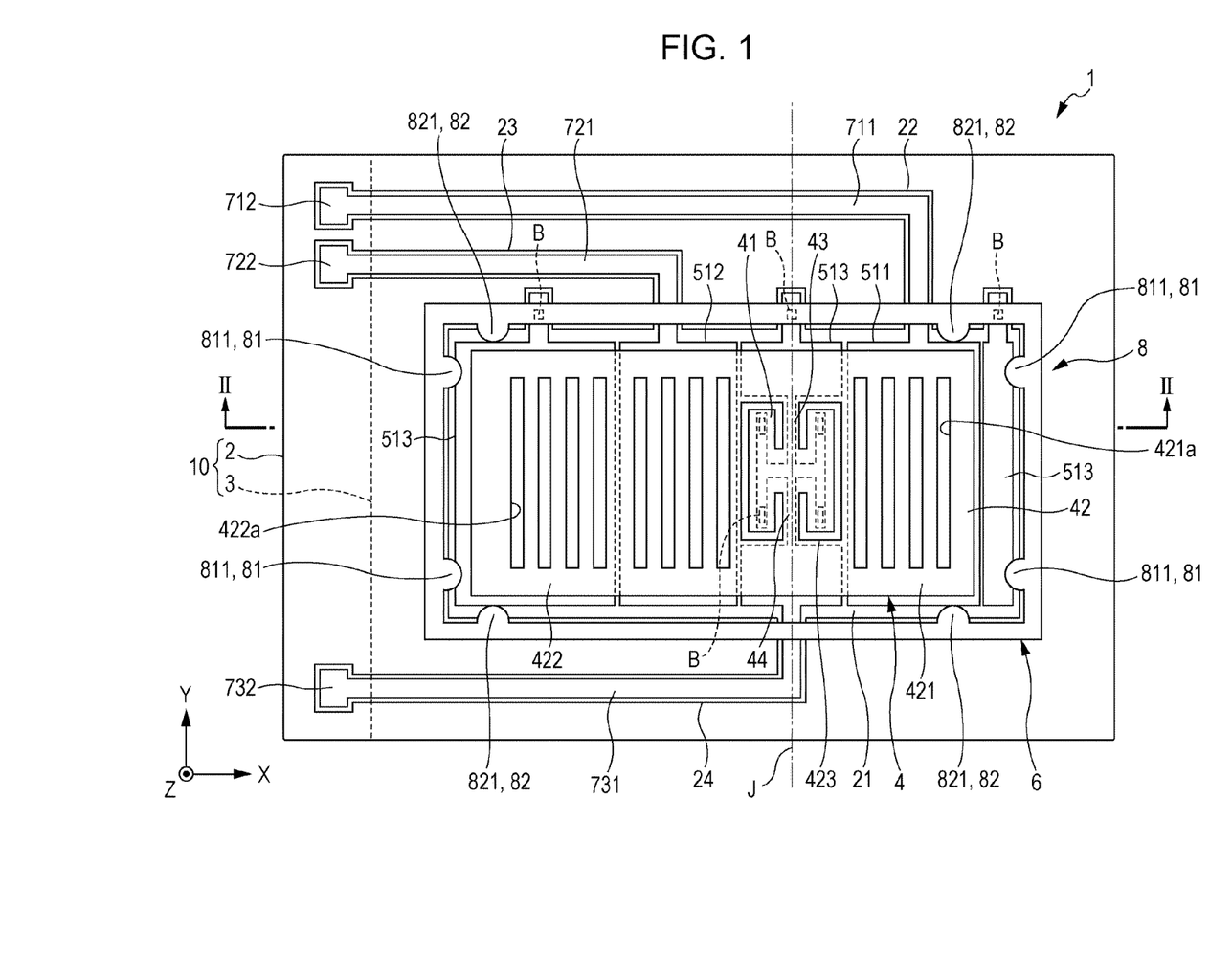
FIG. 1 is a plan view (upper surface view) of a physical quantity sensor according to an embodiment of the invention.
Figure 2:
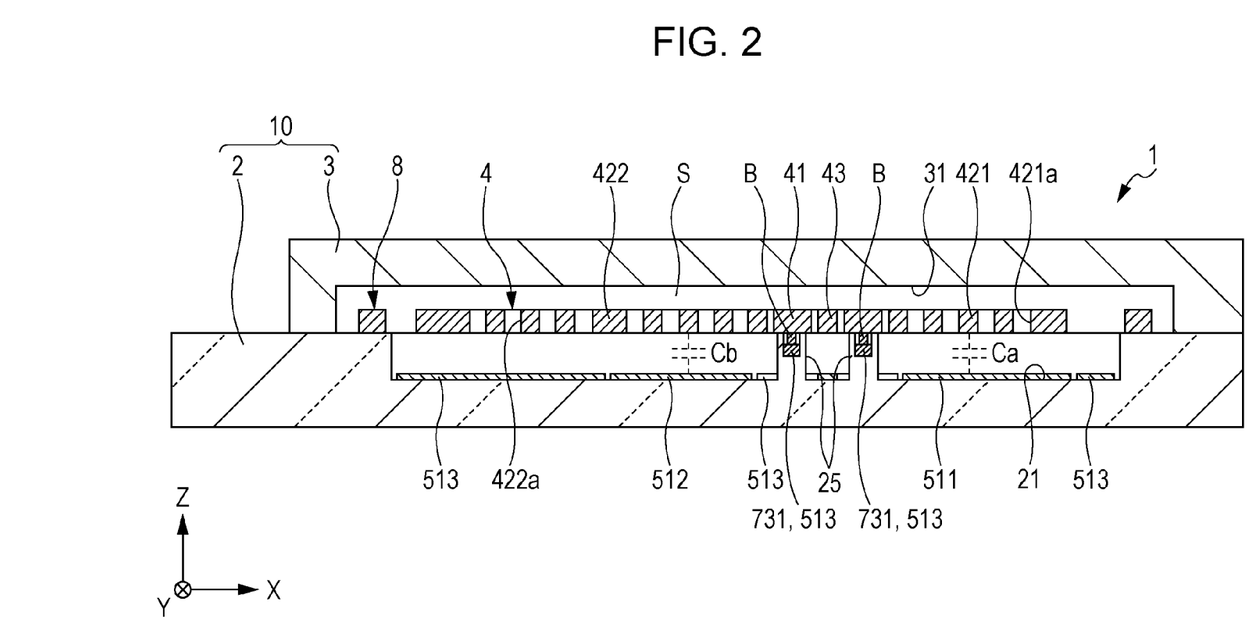
FIG. 2 is a sectional view taken along line II-II in FIG. 1.
Figure 3A:
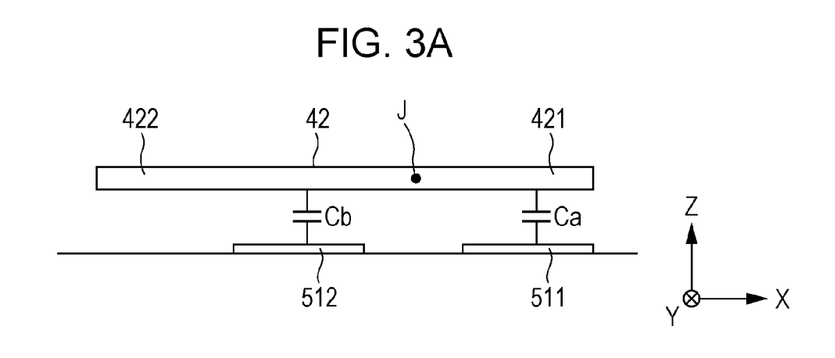
FIGS. 3A, 3B, and 3C are schematic diagrams for explaining driving of the physical quantity sensor indicated in FIG. 1.
Figure 3B:
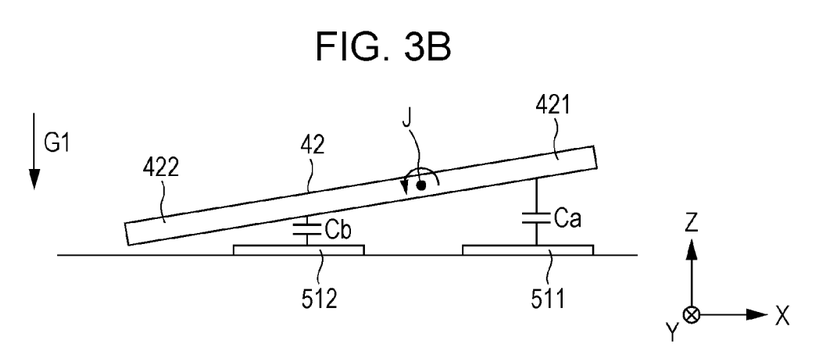
Figure 3C:
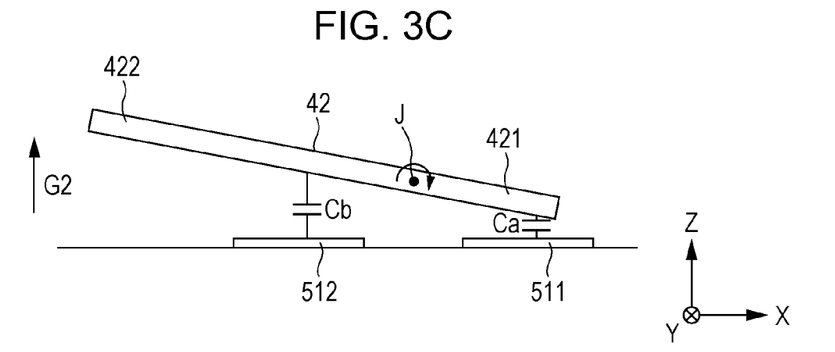

FIG. 1 is a plan view (upper surface view) of a physical quantity sensor according to an embodiment of the invention. FIG. 2 is a sectional view taken along line II-II in FIG. 1. FIGS. 3A, 3B, and 3C are schematic diagrams for explaining driving of the physical quantity sensor indicated in FIG. 1. Here, for convenience of explanation, hereinafter the paper front side (+Z axis side) is referred to as "upper" and the paper rear side (−Z axis side) is referred to as "lower" in FIG. 1. In addition, in each drawing, the X axis, the Y axis, and the Z axis are illustrated as three axes which are orthogonal to one another. In addition, hereinafter a direction which is parallel to the X axis is referred to as an "X axis direction", a direction which is parallel to the Y axis is referred to as a "Y axis direction", and a direction which is parallel to the Z axis is referred to as a "Z axis direction".

A physical quantity sensor 1 which is shown in FIG. 1 and FIG. 2 is able to be utilized as a sensor for measuring acceleration in the Z axis direction (vertical direction). Such a physical quantity sensor 1 has a package 10 which includes a base substrate (substrate) 2 and a lid 3, an element piece (movable electrode) 4 which is arranged in an internal space S inside the package 10, and a frame-form section (peripherally arranged section) 6.

Base Substrate

As shown in FIG. 1 and FIG. 2, a concave section 21 which is open at the upper surface is formed in the base substrate 2. The concave section 21 functions as a clearance section for preventing the element piece 4 and the base substrate 2 coming into contact. In addition, a convex section 25 which protrudes from the bottom surface of the concave section 21 is included in the center section of the concave section 21, and the element piece 4 is fixed in the convex section 25 so as to be able to see-saw rock.

In addition, concave sections 22, 23, and 24 which are open at the upper surface and are connected to the concave section 21 at one end section are formed in the base substrate 2. In planar view, the concave sections 22, 23, and 24 are arranged at the periphery of the concave section 21, and wirings 711, 721, and 731, and terminals 712, 722, and 732 for the element piece 4 are arranged inside the concave sections 22, 23, and 24. In addition, each terminal 712, 722, and 732 is arranged so as to be exposed to an outer section of the package 10, and electrical connection to the outer section (for example, an IC chip) is easy.

In addition, a first detection electrode (first electrode) 511, a second detection electrode (second electrode) 512, and a dummy electrode (third electrode) 513 are arranged on the bottom surface of the concave section 21. Then, the first detection electrode 511 is electrically connected to the wiring 711, the second detection electrode 512 is electrically connected to the wiring 721, and the dummy electrode 513 is electrically connected to the wiring 731.

Such a base substrate 2 is formed from a glass material (for example, borosilicate glass such as Pyrex glass (registered trademark)) which includes alkali metal ions (movable ions). Thereby, it is possible to firmly join the element piece 4 which is formed from a silicon substrate to the base substrate 2 by anodic bonding. However, the configuration material of the base substrate 2 is not limited to a glass material, and, for example, it is possible to use a high-resistance silicon material. In this case, it is possible to perform joining of the element piece 4 via, for example, a resin-based adhesive, a glass paste, a metal layer, and the like.

In addition, the respective configuration materials of the wirings 711, 721, and 731, the terminals 712, 722, and 732, and the electrodes 511, 512, and 513 are not particularly limited as long as the configuration materials have conductivity, and it is possible to use any type of electrode material. For example, a simple metal such as Au, Pt, Ag, Cu, Al, or the like, or a metal such as an alloy which includes Au, Pt, Ag, Cu, Al, or the like is appropriately used.

Element Piece

As shown in FIG. 1 and FIG. 2, the element piece 4 is included above the base substrate 2. The element piece 4 has a support section 41, a movable section 42, and a pair of linking sections 43 and 44 which link the movable section 42 and the support section 41 such that the movable section 42 is able to rock with respect to the support section 41. Then, the linking sections 43 and 44 are set as an axis J, and the movable section 42 is configured so as to see-saw rock with respect to the support section 41.

In addition, the movable section 42 has a longitudinal form (substantially rectangular form) which extends in the X direction, the +X direction (one) side is a first movable section 421, and the −X direction (the other) side is a second movable section 422. In addition, each of the first and second movable sections 421 and 422 are lined up in the X direction, and a plurality of slits 421a and 422a which extend in the Y direction are formed. Thereby, the resistance of the see-saw rocking of the movable section is reduced. In addition, an opening 423 is formed between the first movable section 421 and the second movable section 422, and the support section 41 and the linking sections 43 and 44 are arranged inside the opening 423.

In addition, the first and second movable sections 421 and 422 have rotational moments which are different from one another when acceleration is applied in the vertical direction (Z axis direction), and are designed such that a predetermined inclination is generated in the movable section 42 according to the acceleration. Thereby, when acceleration is generated in the vertical direction, the movable section 42 see-saw rocks about the axis J. In detail, in the present embodiment, the rotational moment of the second movable section 422 is designed so as to be larger than the rotational moment of the first movable section 421 due to the area of the second movable section 422 being larger than the area of the first movable section 421 in planar view, in other words, due to the mass of the second movable section 422 being larger than the mass of the first movable section 421.

Here, the form of the first and second movable sections 421 and 422 as described above is not particularly limited as long as the rotational moments are different from one another, and, for example, may have the same form in planar view with different thicknesses. In addition, the form may be the same and a weight section arranged in one of the movable sections. The weight section may be, for example, a weight material such as tungsten or molybdenum arranged as a separate body, or may be integrally formed with the movable section 42.

In addition, the support section 41 is arranged inside the opening 423, and as shown in FIG. 2, is joined to the convex section 25 of the base substrate 2. In addition, the linking sections 43 and 44 are also arranged inside the opening 423, and the support section 41 and the movable section 42 are linked by the linking sections 43 and 44. In addition, the linking sections 43 and 44 are positioned on the same axis along the Y axis direction on both sides of the support section 41. Thereby, when acceleration is applied in the vertical direction, the movable section 42 see-saw rocks about the axis J while the linking sections 43 and 44 are torsionally deformed.

Such an element piece 4 is integrally formed from a silicon substrate which is doped with impurities such as phosphorus and boron. Thereby, since it is possible to process with high precision by etching, it is possible set superior dimensional precision of the element piece 4. In addition, it is possible to join the element piece 4 to the base substrate 2 by anodic bonding. However, the material of the element piece 4 is not limited to silicon. In addition, the method by which conductivity is imparted is not limited to doping, and, for example, a conductive layer of metal or the like may be formed on the surface of the movable section 42.

In addition, as shown in FIG. 2, the element piece is electrically connected to the wiring 731 (dummy electrode 513) in the support section 41. The electrical connection between the support section 41 and the wiring 731 is performed via a conductive bump B (for example, a gold bump) which is positioned between the support section 41 and the wiring 731.

The arrangement of each of the electrodes 511, 512, and 513 with respect to the element piece 4 is as follows. That is, as shown in FIG. 2, the first detection electrode 511 is arranged so as to oppose the first movable section 421, and forms an electrostatic capacity Ca with the first movable section 421. In addition, the second detection electrode 512 is arranged so as to oppose the second movable section 422, and forms an electrostatic capacity Cb with the second movable section 422. In planar view, the first and second detection electrodes 511 and 512 are arranged substantially line symmetrically with respect to the axis J. In addition, the dummy electrode 513 is arranged so as not to overlap with the first and second detection electrodes 511 and 512, and preferably, such that an exposed portion of glass on the bottom surface of the concave section 21 is small. In detail, the dummy electrode 513 is included so as to be split into three between the first detection electrode 511 and the second detection electrode 512, at the +X axis side of the first detection electrode 511, and at the −X axis side of the second detection electrode 512. Here, the dummy electrode 513 which is positioned between the first detection electrode 511 and the second detection electrode 512 serves as the wiring 731.

Out of the three electrodes 511, 512, and 513, the first and second detection electrodes 511 and 512 are electrodes which are used in acceleration sensing, and the dummy electrode 513 is an electrode for reducing occurrence of sticking during manufacture. As described above, the element piece 4 (including the silicon substrate before the element piece 4 is patterned) and the base substrate 2 are joined by anodic bonding, but at this time, there are cases where electrostatic force is generated between the element piece 4 and the base substrate 2 due to an applied voltage, and the element piece 4 is stuck to the base substrate 2 (the bottom surface of the concave section 21) due to the electrostatic force. For this reason, in the present embodiment, electrostatic force is reduced by including the element piece 4 and the dummy electrode 513 with the same potential on the bottom surface of the concave section 21 which is a surface that opposes the element piece 4 on the base substrate 2, and sticking of such an element piece 4 to the base substrate 2 as described above is reduced.

Frame-Form Section

A frame-form section 6 has a frame form, is included on the periphery of the element piece 4 so as to surround the element piece 4, and is joined to the upper surface of the base substrate 2. In addition, the frame-form section 6 is electrically connected to each dummy electrode 513 via the conductive bump B. Here, the dummy electrode 513 which is positioned in the center is electrically connected to the wiring 731, and the wiring 731 is electrically connected to the movable section 42. For this reason, the movable section 42, the frame-form section 6, and the dummy electrode 513 have the same potential.

Such a frame-form section 6 is not particularly limited as long as the frame-form section 6 has conductivity, but it is preferable to be formed from a silicon substrate which is doped with impurities such as phosphorus and boron. Thereby, it is easy to manufacture the physical quantity sensor 1 since it is possible to collectively form the element piece 4 and the frame-form section 6 from the silicon substrate.

Here, in planar view, it is sufficient if the form of the frame-form section 6 is arranged so as to surround at least a portion of the periphery of the movable section 42, and, for example, the frame-form section 6 may have a defect in the middle, and the frame-form section 6 may be split into two or more.

In addition, a regulating section 8, which regulates displacement (in planar view, displacement in the in-plane direction, that is, displacement in the X axis direction, the Y axis direction, and a combined direction of the X axis and the Y axis) which is different from see-saw rocking of the movable section 42, is included in the frame-form section 6. Such a regulating section 8 has a first displacement regulating section 81 which regulates displacement of the movable section 42 in the X axis direction, and a second displacement regulating section 82 which regulates displacement of the movable section 42 in the Y axis direction.

The first displacement regulating section 81 opposes the movable section 42 in the X axis direction, and has a projecting section 811 which protrudes from the inner circumferential surface of the frame-form section 6 toward the movable section 42. For this reason, for example, when acceleration (an impact) is applied to the physical quantity sensor 1 in the X axis direction, and the movable section 42 is displaced in the X axis direction with respect to the frame-form section 6, the movable section 42 strikes the projecting section 811, and displacement thereafter is regulated. Consequently, it is possible to reduce excessive displacement of the movable section 42 in the X axis direction, and it is possible to reduce damage to the element piece 4.

In the same manner, the second displacement regulating section 82 opposes the movable section 42 in the Y axis direction, and has a projecting section 821 which protrudes from the inner circumferential surface of the frame-form section 6 toward the movable section 42. For this reason, for example, when acceleration (an impact) is applied to the physical quantity sensor 1 in the Y axis direction, and the movable section 42 is displaced in the Y axis direction with respect to the frame-form section 6, the movable section 42 strikes the projecting section 821, and displacement thereafter is regulated. Consequently, it is possible to reduce excessive displacement of the movable section 42 in the Y axis direction, and it is possible to reduce damage to the element piece 4.

Here, the configuration is simplified by configuring the first and second displacement regulating sections 81 and 82 using the projecting sections 811 and 821. In addition, the projecting sections 811 and 821 may be integrally formed with the frame-form section 6, and, for example, may be formed as separate bodies using a relatively soft material such as a resin material, or a rubber material.

Lid

The lid 3 has a concave section 31 which is open at a lower surface, and is joined to the base substrate 2 such that the concave section 31 with the concave section 21 form the internal space S which accommodates the element piece 4. In the present embodiment, such a lid 3 is formed using a silicon substrate. Thereby, it is possible to join the lid 3 and the base substrate 2 by anodic bonding. Here, in a state in which only the lid 3 is joined to the base substrate 2, the inside and the outside of the internal space S are linked via the concave sections 22, 23, and 24 which are formed on the base substrate 2. For this reason, in the present embodiment, the internal space S is hermetically sealed by the concave sections 22, 23, and 24 being sealed by an $SiO_2$ film, which is not shown in the drawings, that is formed using a TEOSCVD method or the like.

The configuration of the physical quantity sensor 1 is described simply above. It is possible for such a physical quantity sensor 1 to sense acceleration in the vertical direction as follows. As shown in FIG. 3A, the movable section 42 is maintained in a horizontal state in a case where acceleration is not applied to the physical quantity sensor 1 in the vertical direction. Then, when acceleration G1 is applied to the physical quantity sensor 1 downward in the vertical direction (the −Z axis direction), since the rotational moments of the first and second movable sections 421 and 422 are different, as shown in FIG. 3B, the movable section 42 see-saw rocks counterclockwise about the axis J as a center. Conversely, when acceleration G2 is applied to the physical quantity sensor 1 upward in the vertical direction (the +Z axis direction), as shown in FIG. 3C, the movable section 42 see-saw rocks clockwise about the axis J as a center. Due to the see-saw rocking of such a movable section 42, the separation distance between the first movable section 421 and the first detection electrode 511, and the separation distance between the second movable section 422 and the second detection electrode 512 are changed, and accordingly the electrostatic capacities Ca and Cb are changed. For this reason, it is possible to detect values of acceleration based on the amount of change of the electrostatic capacities Ca and Cb (a differential signal of the electrostatic capacities Ca and Cb). In addition, it is possible to specify the direction of acceleration (acceleration at the −Z axis side or acceleration at the +Z axis side) from the direction of the change of the electrostatic capacities Ca and Cb. By doing this, it is possible to detect acceleration using the physical quantity sensor 1.

Here, as described above, since the element piece 4 is connected to the wiring 731 via the frame-form section 6, the movable section 42 and the frame-form section 6, which is positioned on the periphery thereof, have the same potential. In this manner, it is possible to cause the movable section 42 to appropriately see-saw rock according to the applied acceleration, and it is possible to sense acceleration with further precision due to the frame-form section 6 which is positioned on the periphery of the movable section 42, and the movable section 42 having the same potential. When described in detail, as shown in FIG. 1, the wirings 711 and 721 which have different potentials from the movable section 42 are arranged on the periphery of the movable section 42. For this reason, electrostatic force is generated between the wirings 711 and 721 and the movable section 42, and sensing precision of the acceleration is reduced due to the electrostatic force inhibiting see-saw rocking of the movable section 42. In contrast to this, in the present embodiment, since the frame-form section 6 with the same potential as the movable section 42 is included on the periphery of the movable section 42 (between the wirings 711 and 721), generation of such electrostatic force as described above is reduced. For this reason, it is possible to cause the movable section 42 to appropriately see-saw rock according to the applied acceleration, and it is possible to sense acceleration with further precision. In particular, in the present embodiment, since the frame-form section 6 has a frame form, and in planar view, surrounds the whole circumference of the movable section 42, it is possible to exhibit the above effect more remarkably.

Electronic Device

Next, an electronic device of the invention will be described.

Figure 4:
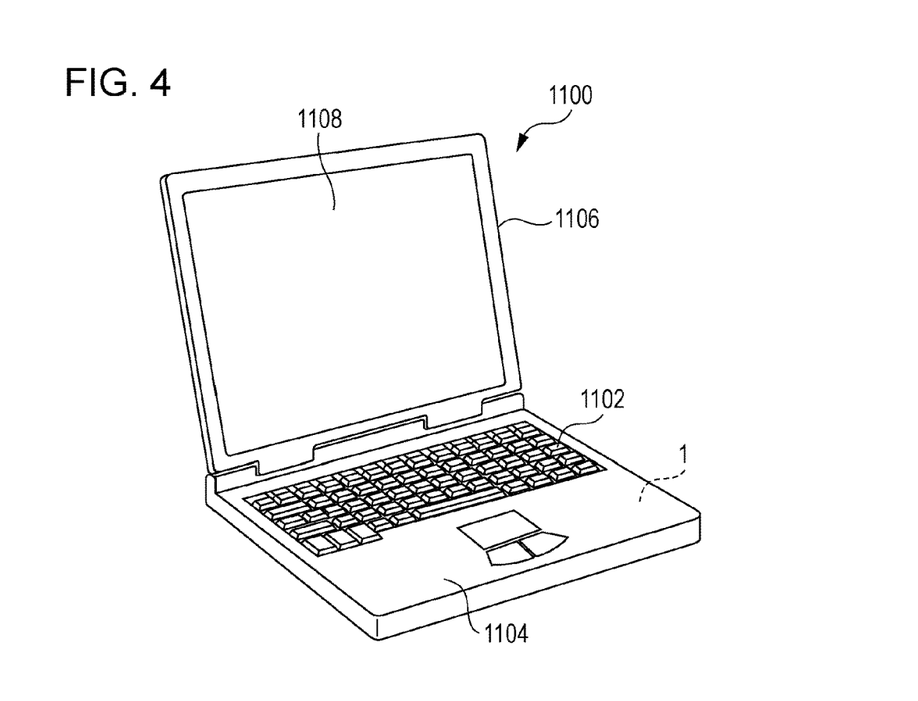
FIG. 4 is a perspective view illustrating a configuration of a mobile-type (or a notebook-type) personal computer to which an electronic device of the invention is applied.

FIG. 4 is a perspective view illustrating a configuration of a mobile-type (or a notebook-type) personal computer to which an electronic device of the invention is applied.

In the drawing, a personal computer 1100 is configured by a main body section 1104 which includes a keyboard 1102, and a display unit 1106 which includes a display section 1108, and the display unit 1106 is supported so as to be able to rotate via a hinge structure section with respect to the main body section 1104. The physical quantity sensor 1, which measures the physical quantity of acceleration, angular velocity, and the like in order to measure falling or inclination of such a personal computer 1100, is mounted in the personal computer 1100. In this manner, it is possible to obtain the personal computer 1100 with high reliability by mounting the physical quantity sensor 1 described above.

Figure 5:
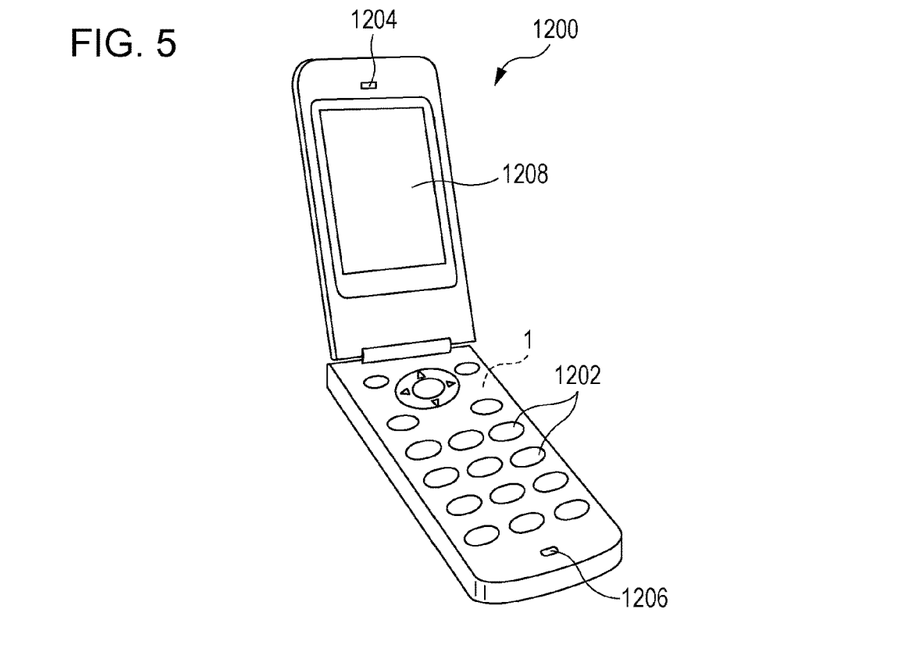
FIG. 5 is a perspective view illustrating a configuration of a mobile phone (also including PHS) to which the electronic device of the invention is applied.

FIG. 5 is a perspective view illustrating a configuration of a mobile phone (also including PHS) to which the electronic device of the invention is applied.

In the drawing, a mobile phone 1200 includes a plurality of operation buttons 1202, a receiving port 1204, and a transmission port 1206, and a display section 1208 is arranged between the operation buttons 1202 and the receiving port 1204. The physical quantity sensor 1, which measures the physical quantity of acceleration, angular velocity, and the like in order to measure falling or inclination of such a mobile phone 1200, is mounted in the mobile phone 1200. In this manner, it is possible to obtain the mobile phone 1200 with high reliability by mounting the physical quantity sensor 1 described above.

Figure 6:
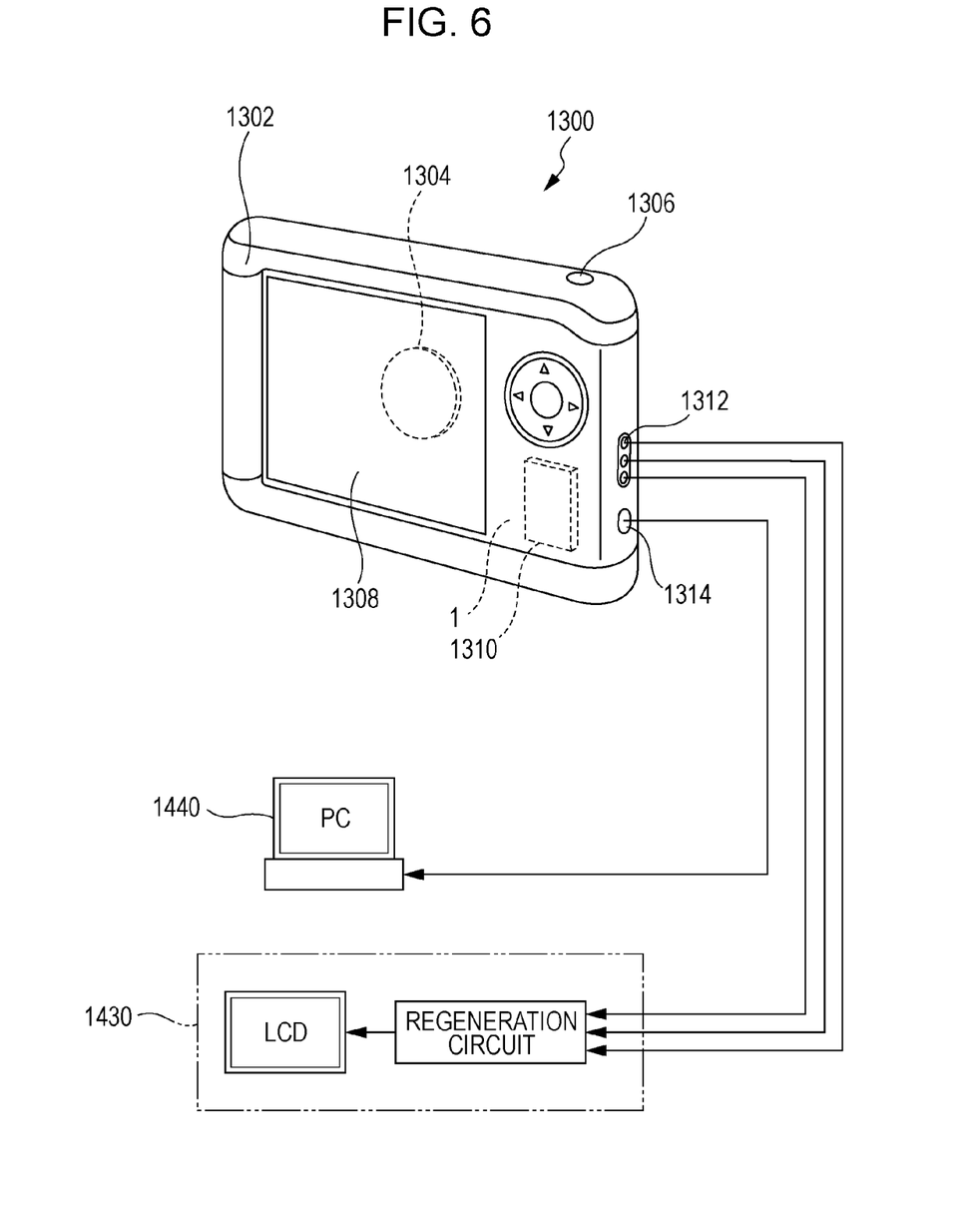
FIG. 6 is a perspective view illustrating a configuration of a digital still camera to which the electronic device of the invention is applied.

FIG. 6 is a perspective view illustrating a configuration of a digital still camera to which the electronic device of the invention is applied. Here, the drawing also illustrates the connection of an external device in a simplified manner.

The digital still camera 1300 generates an imaging signal (image signal) by photoelectric conversion of an optical image of a subject using an imaging element such as a charge coupled device (CCD). The display section 1308 is included on the rear surface of a case (body) 1302 in the digital still camera 1300, and is configured to perform display based on the imaging signal using the CCD, and the display section 1308 functions as a viewfinder which displays a subject as an electronic image. In addition, a light-receiving unit 1304 which includes an optical lens (imaging optical system), CCD, and the like is included at the front surface side (the rear surface side in the drawing) of the case 1302.

A subject image which is displayed on the display section 1308 is confirmed by a photographer, and at the point in time when a shutter button 1306 is pressed down, the imaging signal of the CCD is transferred and stored in a memory 1310. In addition, a video signal output terminal 1312 and an input and output terminal 1314 for data communication are included on a side surface of the case 1302 in the digital still camera 1300. Then, as exemplified, a liquid crystal display 1430 is connected to the video signal output terminal 1312, or a personal computer 1440 is connected to the input and output terminal 1314 for data communication according to need. Furthermore, using a predetermined operation, the imaging signal which is stored in the memory 1310 is configured so as to be output to the liquid crystal display 1430 or the personal computer 1440. The physical quantity sensor 1, which measures the physical quantity of acceleration, angular velocity, and the like in order to measure falling or inclination of such a digital still camera 1300, is mounted in the digital still camera 1300. In this manner, it is possible to obtain the digital still camera 1300 with high reliability by mounting the physical quantity sensor 1 described above.

Here, in addition to the personal computer in FIG. 4, the mobile phone in FIG. 5, and the digital still camera in FIG. 6, it is also possible to apply the electronic device of the invention to, for example, a smartphone, an ink jet-type discharging apparatus (for example, an ink jet printer), a television, a video camera, a video tape recorder, a car navigation device, a pager, an electronic organizer (including those having a communication function), an electronic dictionary, an electronic calculator, an electronic game device, a word processor, a work station, a video phone, a television monitor for crime prevention, a pair of electronic binoculars, a POS terminal, medical equipment (for example, an electronic thermometer, a blood pressure meter, a blood glucose meter, an electrocardiographic measuring device, an ultrasonic diagnostic device, or an electronic endoscope), a fish finder, various measurement equipment, an instrument (for example, an instrument for a vehicle, an aircraft, or a ship), a flight simulator, and the like.

Mobile Body

Next, a mobile body of the invention will be described.

Figure 7:
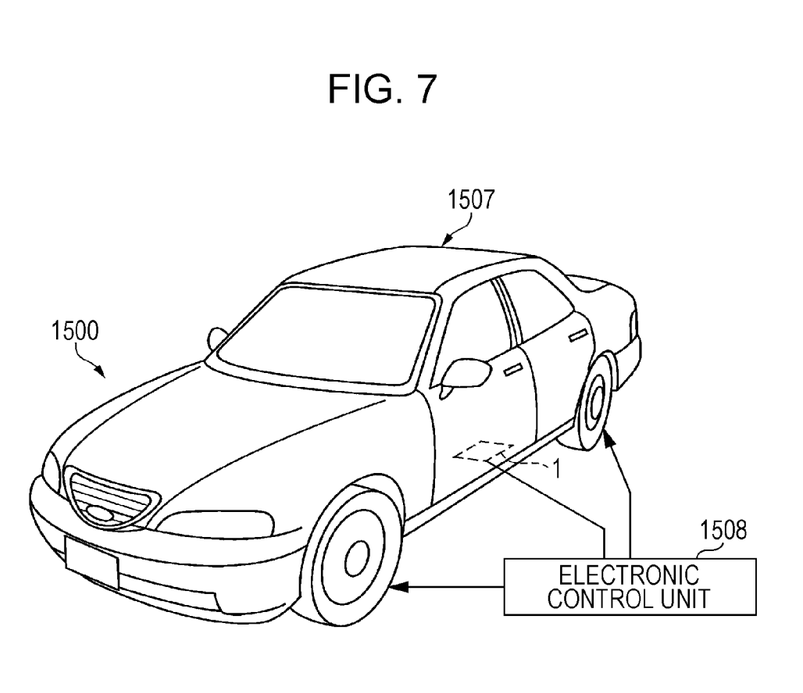
FIG. 7 is a perspective view schematically illustrating an automobile as an example of a mobile body of the invention.

FIG. 7 is a perspective view schematically illustrating an automobile as an example of the mobile body of the invention.

Various control units in which the physical quantity sensor 1, which processes various control signals, is included are mounted in an automobile 1500. For example, as shown in FIG. 7, an electronic control unit (ECU) 1508 with a built-in sensor, which senses acceleration of the automobile 1500, and controls output from an engine is mounted on a vehicle body 1507 in the automobile 1500 as a mobile body. The physical quantity sensor 1, which measures the physical quantity of acceleration, angular velocity, and the like of the vehicle body 1507, is mounted in the electronic control unit 1508. In this manner, it is possible to execute appropriate engine output control with high precision according to the posture of the vehicle body 1507, and obtain the automobile 1500 as a relatively mobile body in which consumption of fuel and the like is suppressed by mounting the physical quantity sensor 1 described above.

In addition, it is also possible to widely apply the physical quantity sensor 1 to a vehicle body posture control unit, a keyless entry system, an immobilizer, a car navigation system, car air conditioning, an anti-lock brake system (ABS), an airbag, a tire pressure monitoring system (TPMS), and the like.

The physical quantity sensor, the electronic device, and the mobile body of the invention are described above based on the embodiments of the drawings, but the invention is not limited thereto, and it is possible for the configuration of each section to be substituted with an arbitrary configuration which has the same function. In addition, other arbitrary constructions may be added to the invention.

In addition, in the embodiment described above, a configuration in which the physical quantity sensor has a regulating section is described, but the regulating section may be omitted. In addition, in the embodiment described above, a configuration in which the physical quantity sensor has a dummy electrode is described, but the dummy electrode may be omitted. In addition, in the embodiment described above, a case of being applied to an acceleration sensor is described, but the invention may also be applied to an angular velocity sensor, and may be applied to a compound sensor in which the acceleration sensor and the angular velocity sensor are integrated.

The entire disclosure of Japanese Patent Application No. 2014-172676, filed Aug. 27, 2014 is expressly incorporated by reference herein.

What is claimed is:

1. A physical quantity sensor comprising:
a movable electrode which includes a movable section that has a first movable section which is included at one side and a second movable section which is included at the other side that has a rotational moment, which is generated when acceleration is applied, that is different from the first movable section, and that is supported so as to be able to rock about an axis which is positioned between the first movable section and the second movable section;
a first electrode which is arranged so as to oppose the first movable section;
a second electrode which is arranged so as to oppose the second movable section;
a third electrode which is arranged so as to oppose the movable section, and not to overlap with the first electrode and the second electrode in planar view of the movable section, and has the same electric potential as the movable electrode; and
a peripherally arranged section which is arranged so as to surround at least a portion of a periphery of the movable section in planar view of the movable section, and which has the same electric potential as the movable electrode,
wherein the third electrode includes a first portion between the first electrode and the second electrode, a second portion adjacent the first electrode such that the first electrode is disposed between the first portion and the second portion, and a third portion adjacent the second electrode such that the second electrode is disposed between the first portion and the third portion,
wherein the first portion overlaps both of the first movable section and the second movable section in a plan view of the movable section, and
wherein the first portion overlaps the axis in the plan view.

2. The physical quantity sensor according to claim 1, wherein the peripherally arranged section is electrically connected to the movable electrode.

3. The physical quantity sensor according to claim 1, wherein the peripherally arranged section has a frame form which surrounds a whole of the movable section in planar view of the movable section.

4. The physical quantity sensor according to claim 1, wherein a regulating section, which regulates displacement in a direction that is different from the rocking of the movable section, is included in the peripherally arranged section.

5. The physical quantity sensor according to claim 4, wherein the regulating section has a projecting section which protrudes from the peripherally arranged section toward the movable section.

6. An electronic device comprising:
the physical quantity sensor according to claim 1.

7. An electronic device comprising:
the physical quantity sensor according to claim 2.

8. An electronic device comprising:
the physical quantity sensor according to claim 3.

9. An electronic device comprising:
the physical quantity sensor according to claim 4.

10. An electronic device comprising:
the physical quantity sensor according to claim 5.

11. A mobile body comprising:
the physical quantity sensor according to claim 1.

12. A mobile body comprising:
the physical quantity sensor according to claim 2.

13. A mobile body comprising:
the physical quantity sensor according to claim 3.

14. A mobile body comprising:
the physical quantity sensor according to claim 4.

15. The physical quantity sensor according to claim 1, wherein the third electrode is directly electrically connected to the movable electrode.

16. The physical quantity sensor according to claim 1, wherein each of the first, second, and third electrodes are located the same distance away from the movable electrode.

* * * * *